United States Patent
Hofflinger et al.

Patent Number: 5,635,753
Date of Patent: Jun. 3, 1997

[54] INTEGRATED CIRCUIT

[75] Inventors: Bernd Hofflinger, Allmandring 30a, Stuttgart; Volker Dudek, Korntal-Munchingen, both of Germany

[73] Assignee: Bernd Höfflinger, Stuttgart, Germany

[21] Appl. No.: 256,237

[22] PCT Filed: Dec. 30, 1992

[86] PCT No.: PCT/DE92/01090

§ 371 Date: Sep. 2, 1994

§ 102(e) Date: Sep. 2, 1994

[87] PCT Pub. No.: WO93/13547

PCT Pub. Date: Jul. 8, 1993

[30] Foreign Application Priority Data

Dec. 30, 1991 [DE] Germany ............ 41 43 209.6

[51] Int. Cl.$^6$ ............................................. H01L 29/04
[52] U.S. Cl. .................. 257/621; 257/503; 257/514; 257/515; 257/519; 257/520; 257/774; 257/544
[58] Field of Search .................................. 257/544, 503, 257/514, 515, 519, 520, 621, 774

[56] References Cited

U.S. PATENT DOCUMENTS

| | | | |
|---|---|---|---|
| 4,631,570 | 12/1986 | Birrittella et al. | 257/544 |
| 4,819,052 | 4/1989 | Hutter | 257/544 |
| 5,065,216 | 11/1991 | Suzuki et al. | 257/544 |

*Primary Examiner*—Edward Wojciechowicz
*Attorney, Agent, or Firm*—Antonelli, Terry, Stout & Kraus, LLP

[57] ABSTRACT

Disclosed is an integrated circuit having at least two active components, such as transistors, having the following features:

a highly conductive substrate is provided which is connected to one pole of a voltage supply source, a semiconductor layer, which is electrically isolated from the substrate and divided into individual sections by lateral isolation regions, is disposed on a main surface of the substrate, placed in each section is at least one active component, e.g., a transistor of any type performance, and lateral deep diffusion regions which are accommodated in the semiconductor layer create a conductive connection between the highly conductive substrate and the corresponding regions of the active components.

23 Claims, 7 Drawing Sheets

INTEGRATED CIRCUIT

TECHNICAL FIELD

The present invention relates to an integrated circuit having at least two active components, such as transistors.

STATE OF THE ART

Integrated circuits of this type are common knowledge and are manufactured on a large scale in various "MOS" and/or bipolar technology.

Presently, attempts are being made to further reduce the size of circuit structures in order to, on the one hand, increase packing density and, on the other, to raise elementary frequency.

In conventional CMOS technology, a number of problems arise, in particular, when attempting to manufacture scaled down design schemes in the submicrometer structural region. It must be kept in mind that the typical structural size of circuits presently in production is in the order of about 0.8 µm, whereas the typical structural size of circuits presently under development is intended to be in the order of about 0.4 µm.

Examples of these scaling problems are:

1. CMOS transistors that switch faster and have a greater bandwidth have to be manufactured by reducing the lateral and vertical structural dimensions. This demands many compromises resulting in, e.g., not ideally quadrupling the circuit speed when halving the channel length, but rather just in increasing the circuit speed to, in some instances, less than 50%. Simultaneously, the internal amplification of the transistors decreases practically linearly to the reduction in structural dimensions so that these transistors and circuits are no longer suitable for rapid analog circuits.

2. The increased packing density aggravates parasitic effects, such as cross-talk, latch-up and voltage fluctuations on the supply lines with the circuit signal-to-noise ratio simultaneously becoming smaller.

3. Scattering of the electric transistor parameters is usually dependent on the width variations of the structuring parameters which in the event of small signal-to-noise ratios and strong cross-talk threatens digital circuits and makes rapid analog CMOS circuits impossible.

4. Reduction of the lateral structural dimensions if the thickness of the layers cannot be correspondingly reduced results in an increase in contact and transition resistances and, if the current densities increase simultaneously, in ageing and failure problems occurring in the circuits due to material transport and metallurgical alterations in the interfaces of the material (e.g., between silicon and metallizations), including electromigration.

An integrated semiconductor circuit composed of a substrate having a conductive layer on the back surface of the substrate and multiple semiconductor layers on the front surface of the substrate is described in U.S. Pat. No. 5,065,216. Very special conductive paths are provided with which the supply voltages can be led from the back side of the circuit to the active elements.

U.S. Pat. No. 4,631,570 discloses an integrated circuit which discloses hidden oxide isolations and a substrate having negligible resistance which is suitable for connecting.

An isolation structure composed of double and hidden oxide layers is presented in the article "Electronic Letters", vol. 25, no. 16, 3 Aug. 1989, pages 1071–1072" In this case, the SIMOX concept is utilized. SIMOX $n^{3o}$ substrates are, however, less suitable due to the poor quality of their oxide bottom side.

The presented state of the art has in common that no highly conductive substrate is provided to which a pole of a supply source is connected, that there is no electrical isolation due to a dielectric isolation layer between the highly conductive substrate and the semiconductor layer, and that the fabrication of the epitaxial layers occurs in an unfavorable sequence of layers.

Moreover, the substrates of the cited documents possess no "active" function for the top transistors, due to which possible simplification of realization of the circuits in the state of the art is not considered.

DESCRIPTION OF THE INVENTION

The object of the present invention is to provide an integrated circuit having at least two active components, permitting packing densities with minimized contact and cross-talk problems.

A solution thereto in accordance with the present invention is set forth in the appended claims.

An element of the present invention is that the integrated circuit has the following features:

a highly conductive substrate is provided which is connected to one pole of a voltage supply source, a semiconductor layer, which is electrically isolated from the substrate and divided into individual sections by lateral isolation regions, is disposed on a main surface of the substrate, placed in each section is at least one active component, e.g., a transistor of any type performance, lateral deep diffusion regions which are accommodated in the semiconductor layer create a conductive connection between the highly conductive substrate and the corresponding regions of the active components.

Contact and cross-talk problems are suppressed by the "active" highly conductive substrate which is connected to one pole of a voltage supply source. Furthermore, half a wiring plane is gained with the active substrate.

This embodiment of the present invention permits the greatest packing density with minimal complexity. The simplicity and the planarity of the construction of the an integrated circuit according to the present invention optimizes the yield and minimizes production costs.

Moreover, very high currents per unit of area and, therefore, very high circuit speeds are possible due to, e.g., the lateral isolation. Finally, the invention, as can be seen from the disclosed preferred embodiments, permits optimizing the amplification and the bandwidth.

The present invention, as defined by the appended claims, has the following improved aspects, although not limited thereto:

The highly, conductive substrate according to the present invention, may be composed of a metal, a metal alloy or a semiconducting material, for example $p^+$-silicon.

The highly conductive metal substrate and the semiconductor layer can be electrically isolated by a barrier semiconductor metal junction whereas the highly conductive semiconductor substrate and the semiconductor layer can be electrically isolated by a barrier p/n-junction or a dielectric isolation layer.

The lateral isolation regions, according to the invention, can also be formed by barrier p/n-junctions or by dielectric isolation layers.

It is preferable, according to the present invention, that the lateral isolation regions are composed of approximately hollow-cylindrical oxide regions which are filled with the material having the same type of conductivity as the highly conductive substrate on which an insulating covering coat and, in particular, a silicon oxide layer is provided.

The present invention and the above-noted and other objectives, features and advantages thereof will be better understood from the following detailed description, without the intention of limiting the scope or spirit of the overall inventive idea thereto, of the preferred embodiments with reference to the accompanying drawings, by way of example.

BRIEF DESCRIPTION OF THE DRAWINGS

FIG. 1 shows a first preferred embodiment of an invented integrated circuit having at least two active components, such as transistors. The circuit has a highly conductive substrate (1) which is connected to one pole of a voltage supply source. Parasitic effects, notably cross-talk if the packing density is very great, fluctations on the supply lines and contact ageing problems are distinctly reduced by this highly conductive substrate (1). In the case of the depicted preferred embodiment, a highly doped "active" (preferably $p^+$) substrate (1) is employed which serves to convey current away as well as provide a stable reference potential (mass). This "active" substrate offers an additional "half" wiring plane. Naturally, a substrate having a different type of conductivity can also be employed.

Figure 1:
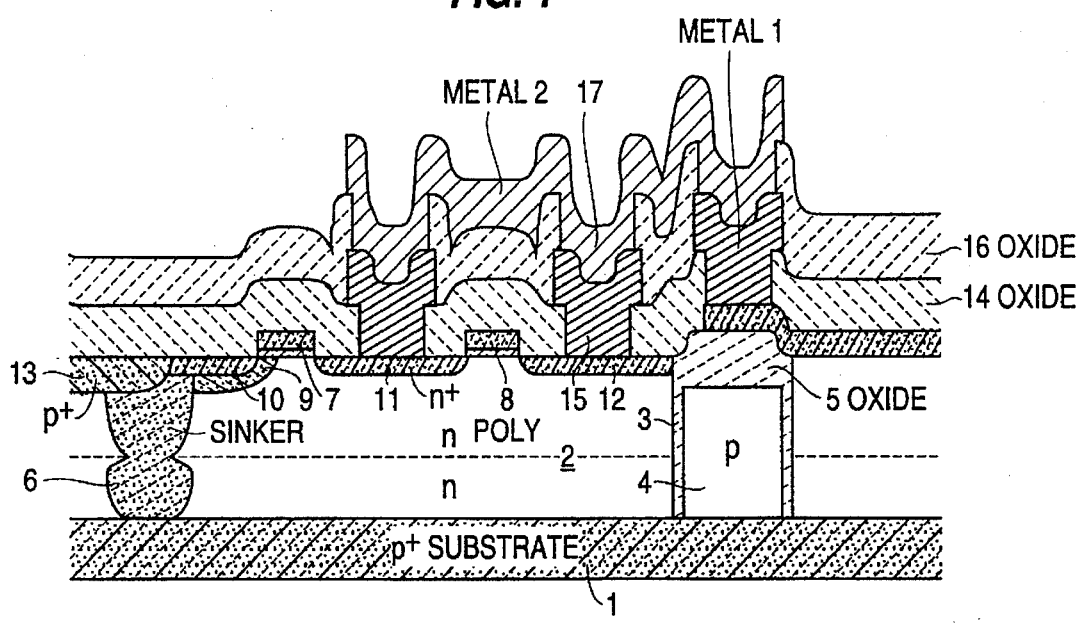
FIGS. 1 to 6 and 8 to 11a–b show various preferred embodiments of the present invention.

A semiconductor layer (2), which is preferably an active, oppositely doped (preferably N-type) silicon film (2) conventionally produced using epitaxy is provided to a main surface of the substrate (1). Silicon disks of this type can be inexpensively obtained from disk manufacturers. The doping of this film is selected in such a manner that N-channel transistors having optimum drift ranges, N-channel transistors of the depletion type and suitable islands for P-channel transistors are created.

The film (2) is electrically isolated from substrate (2).

Another element of the present invention is that film (2) is divided into individual sections by lateral isolation regions. The lateral isolation occurs, preferably, by a dielectric isolation in which a silicon core (4) is placed inside an oxide wall (3). For this purpose, a nitride masking is preferably employed as mask 1. Groove etching usually using reactive ion etching to a depth of the $p^+$-substrate (1) is conducted, with the depth not being critical. The side of the grooves are thermally oxidized and then the oxide bottom is removed, e.g., by directed reactive ion etching in this way, silicon seed regions are created from which silicon cores can selectively grow in the epitaxy reactor approximately to the level of the silicon surface. These surfaces are then thermally oxidized in such a manner that a field oxide (5) running almost coplanar to the surrounding silicon surfaces is yielded.

At all sites at which contacts for negative voltage supply (mass) are required, $p^+$ deep diffusion regions (sinker 6) are provided using a mask 2. These lateral deep diffusion regions (6), which are provided in the semiconductor layer, produce a conductive bond between the highly conductive substrate (1) and the corresponding regions of layer (2).

Subsequently, a gate oxide film is thermally grown on all the silicon islands and a polysilicon layer is usually precipitated thereon as the gate material. The polysilicon regions (7, 8) are structured using a mask 3.

In order to place in each section at least one active component, respectively a transistor of any type, the procedure is as follows.

Regions (9) are laid bare using a photoresist mask 4, in which a p-type ion implantation, e.g. using boron, is conducted in such a manner that the polysilicon edges of the gates serve as a mask in the transistors to be built. These boron regions are diffusion regions of a suitable depth. Now the silicon disk is implanted with $n^+$ ions over the entire surface (e.g. using arsenic). In this manner, the source and drain regions (10–12) of the NMOS transistors are created. The $n^+$-source region, p-channel the sinker are connected and by means of a $p^+$-implantation (mask 5). Yielded are now so-called double diffusion type NMOS transistors. The electric channel length of these transistors is only determined by the difference between the diffusion depth of boron and arsenic similar to the base width in NPN bipolar transistors. Variations in these critical dimensions are now no longer related to variations in lithographic structuring, and transistors are obtained having microscopically and macroscopically minimal variations in the electrical parameters on the silicon disks.

Now there are two types of NMOS transistors. The double diffusion DMOS transistors are of the enhancement type (conventionally switched off). Their function may be understood as the serial circuit of an enhancement transistor having an extremely short channel length (less than 0.3 µm) in series with an N-conductive drift path which is, in addition, also directed by the gate lying over it into great electron collection. This type of transistor is distinguished by a very steep rise rate, respectively a very great current, being produced with the very short enhancement channel and the ensuing drift path minimizing the potential influence of the drain on the controlled path on the source side yielding, in this way, a negligible channel length modulation and therefore optimum, high internal voltage amplification in this transistor. The field strength distributed over the drift path with a given drain voltage (e.g. supply voltage 5 V) is reduced in such a manner that hot charge carrier problems and respective transistor degradation problems are prevented.

This MIS type of transistor has, in principle, the largest possible amplification bandwidth, respectively the highest circuit speed. Moreover, an NMOS transistor with the gate (8), which is of the depletion type, i.e. conventionally conductive, is created in the hitherto process cycle. This transistor is suitable as a gate-controlled resistance and, therefore, as a load element. Its electrical channel length corresponds to the geometric width of the polysilicon gate, which should be designed in a manner that it is suitable for the respective circuits.

A particularly advantageous design of the DMOS transistors is if the gate, the drain and, if need be, the lateral isolation are arranged concentrically, respectively practically hexagonally around the source and sinker regions.

Next the intermediate oxide is provided to a disk surface which only has a raised profile due to the polysilicon structures. The conformity of this oxide can be, therefore, inexpensively produced. In this manner, structuring the contact holes in this isolation film is simplified (mask 6).

A negligible surface structure also favorably influences the subsequent films including metal 1 (mask 7), intermediate oxide with VIAS (mask 8) and metal 2 (mask 9).

This yields an overall process which offers with only nine masks MOS technology for the highest speeds which, in addition, is also suitable for very high-frequency, analog circuits. With regard to speed, this technology is comparable to Bi-CMOS technology employing 17 mask processings.

Figure 2:
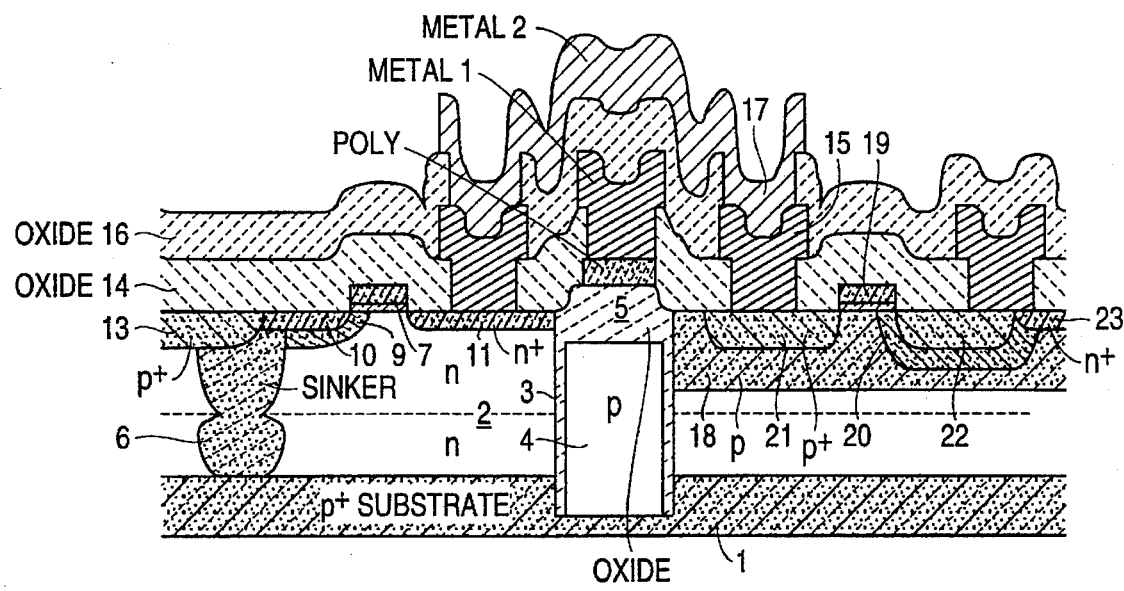

An embodiment of an integrated circuit (also referred to as SUPER-MOS technology), according to the invention, having complementary DMOS transistors is shown in FIG. 2.

For a p-channel DMOS transistor, a p-sector (18) is needed that should be provided with a mask 10 before the formation of the poly regions.

After structuring the poly gates (7, 19), with mask 11 the n-base (20) is provided. Then with mask 5 the p$^+$-sectors (13, 21, 22) as well as with mask 12 the N-sectors (10, 11, 12, 23) are provided.

Figure 3:
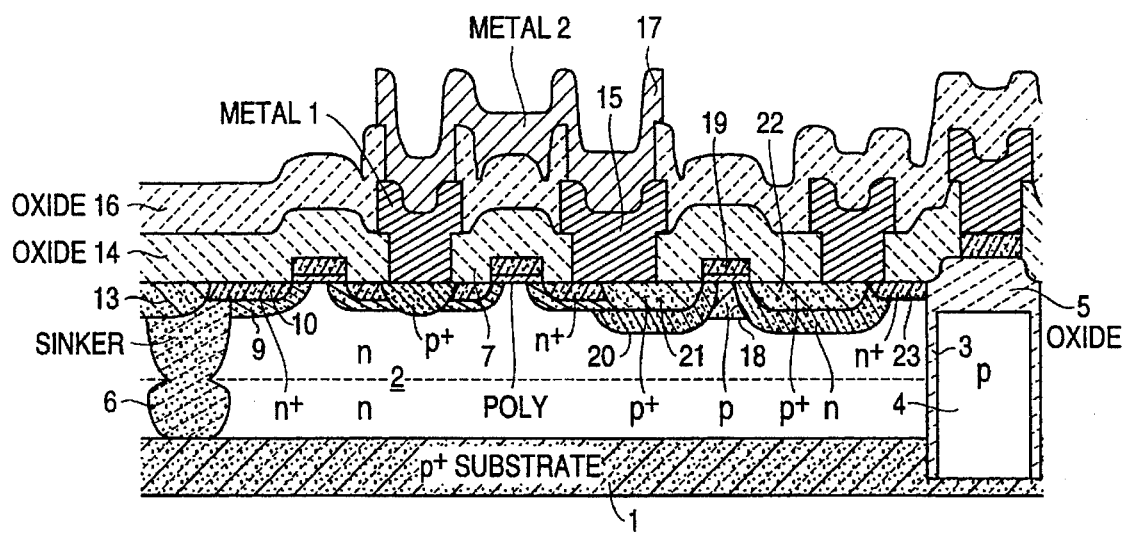

Therefore, a submicron high performance complementary DMOS technology can be produced with only 12 masks (11 masks with junction isolation):

Transistors with symmetrical base, respectively channel regions for use in transmission gates, for increasing transistor density and for reducing the number of masks can be made according to FIG. 3.

Only 10 masks are required according to FIG. 3 for symmetrical, complementary, double diffusion transistors:

| Mask 1 | Trench (4) |
| --- | --- |
| Mask 2 | Sinker (6) |
| Mask 3 | p-drift path (18) |
| Mask 4 | Poly gates (7,19) |
| Mask 5 | P-channel and N+-regions |
| Mask 6 | N-channel and P+-regions |
| Mask 7 | Contacts |
| Mask 8 | Metal 1 |
| Mask 9 | VIA |
| Mask 10 | Metal 2 |

The properties of these symmetrical transistors including rate of rise and gain-bandwidth product as well as resistance against hot electrons will be somewhat weaker than the unsymmetrical, optimized transistors. This disadvantage is compensated by the simplicity of the procedure.

Figure 4:
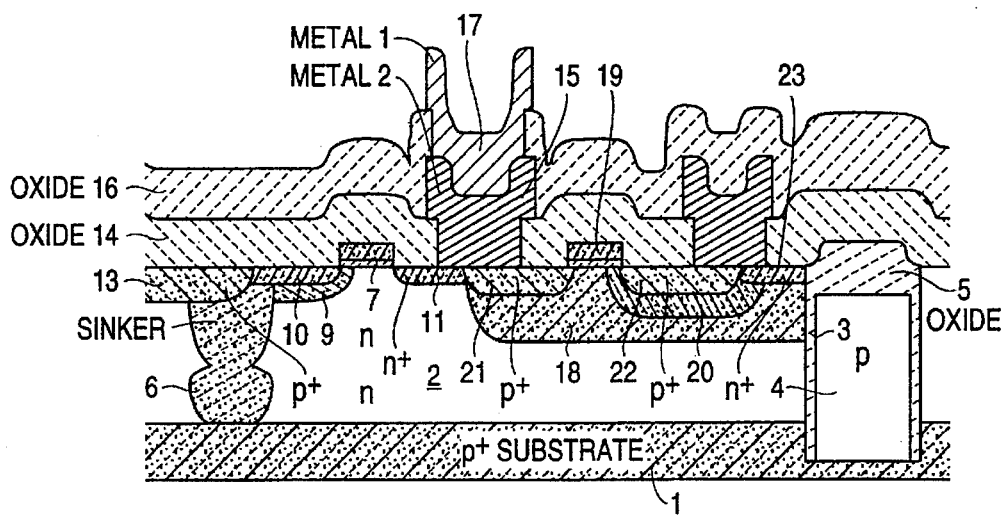

Great packing density can be obtained in the complementary circuits by being able to place the complementary drain regions with common circuit junctions directly side by side without any lateral isolation (FIG. 4).

For distributed single transistors as well as for complementary push-pull transistor types with concentric gates and drains, the lateral isolation can be obviated and thus eliminating one mask (trench).

Figure 5:
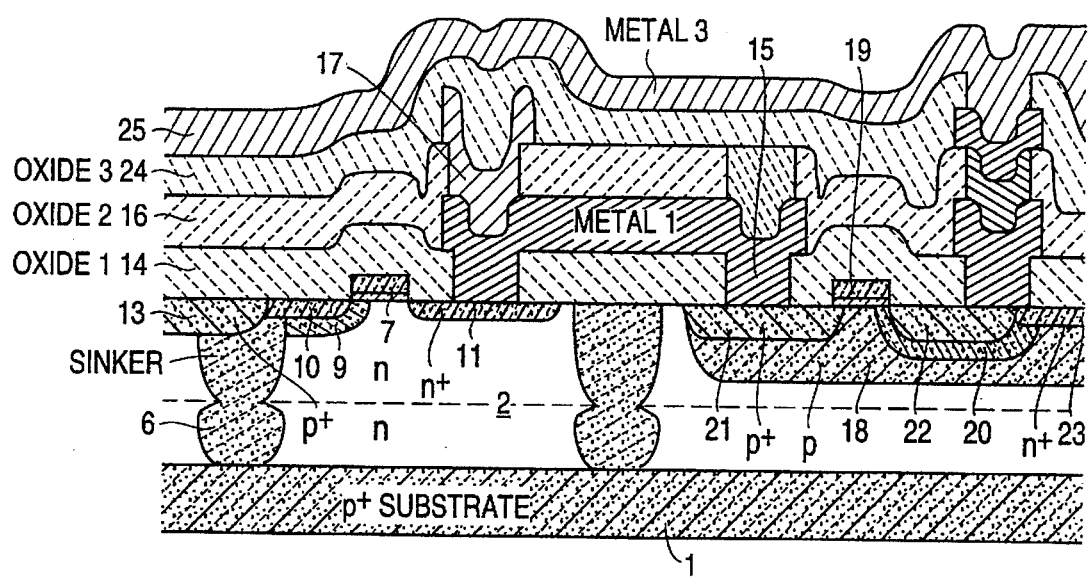

The lateral isolation with a trench permits great packing density. However, instead of this a p$^+$-sector can also be employed which is simultaneously generated with the sinker (6) (FIG. 5). Trench etching, wall oxidation and filling the grooves with silicon can be obviated.

Three-layer metallization has the advantage that the entire area of the third metal (25) can be utilized for the positive voltage supply, for the removal of stray power, for EM-screening and for reduction of cross-talk.

Figure 6:
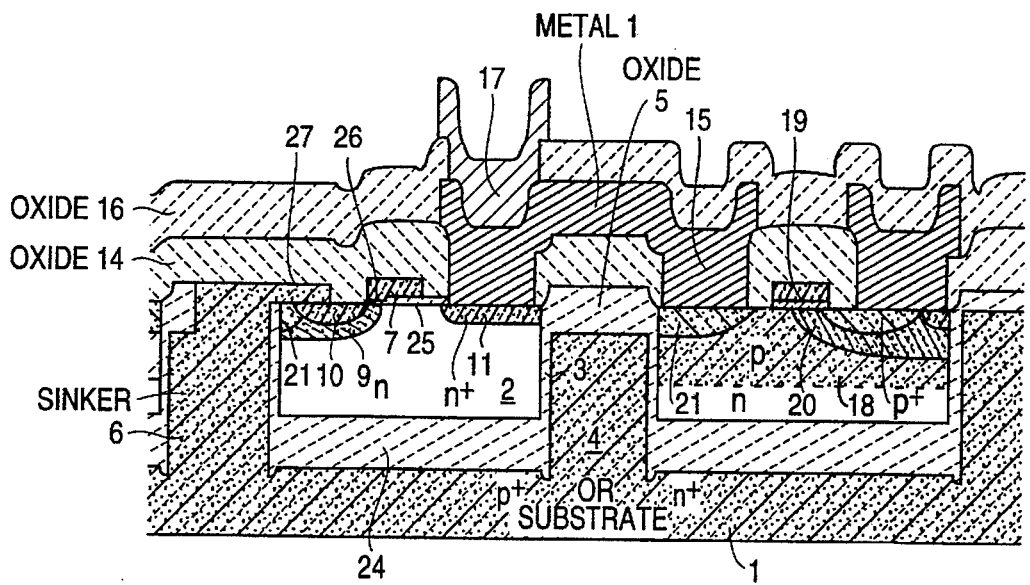

FIG. 6 shows another preferred embodiment of the present invention in which the integrated circuit is realized on a direct-bonding substrate. In a first step, two wafers with an oxide surface (24) are "directly bonded". For this purpose commercial wafers (1) with p$^+$- or n$^+$-doping are utilized. In the shown preferred embodiment, the top wafer (2) has an n-epidoping. Subsequently the top silicon layer is removed down to the n-epidoping in such a manner that a silicon layer with a thickness of 2 to 5 μm remains.

In the second step, the trench and the sinker are generated. For this purpose, trench etching occurs with a mask 1; subsequently the oxide walls (3) are doped. Like in the preferred embodiment shown in FIG. 1, the seed is opened by means of selective epitaxy (4) and the epitaxy oxidized up to a layer (5). The selective epitaxy also creates the sinker (6).

In a third step, the gate oxidation (25) and the thin gate oxide (26) occur with a mask 2. With a mask 3, polysilicon is precipitated and structured.

In further steps, the p-trough is generated with a mask 4 and the channels (9, 20) and the source, drain and bulk regions (11, 21) with masks 5 to 8.

The seed is etched with mask 9 for contacting the sinker. Subsequently a selective epitaxy step (region 27) occurs. The fabrication process is completed with masks 10 to 13.

Figure 7:
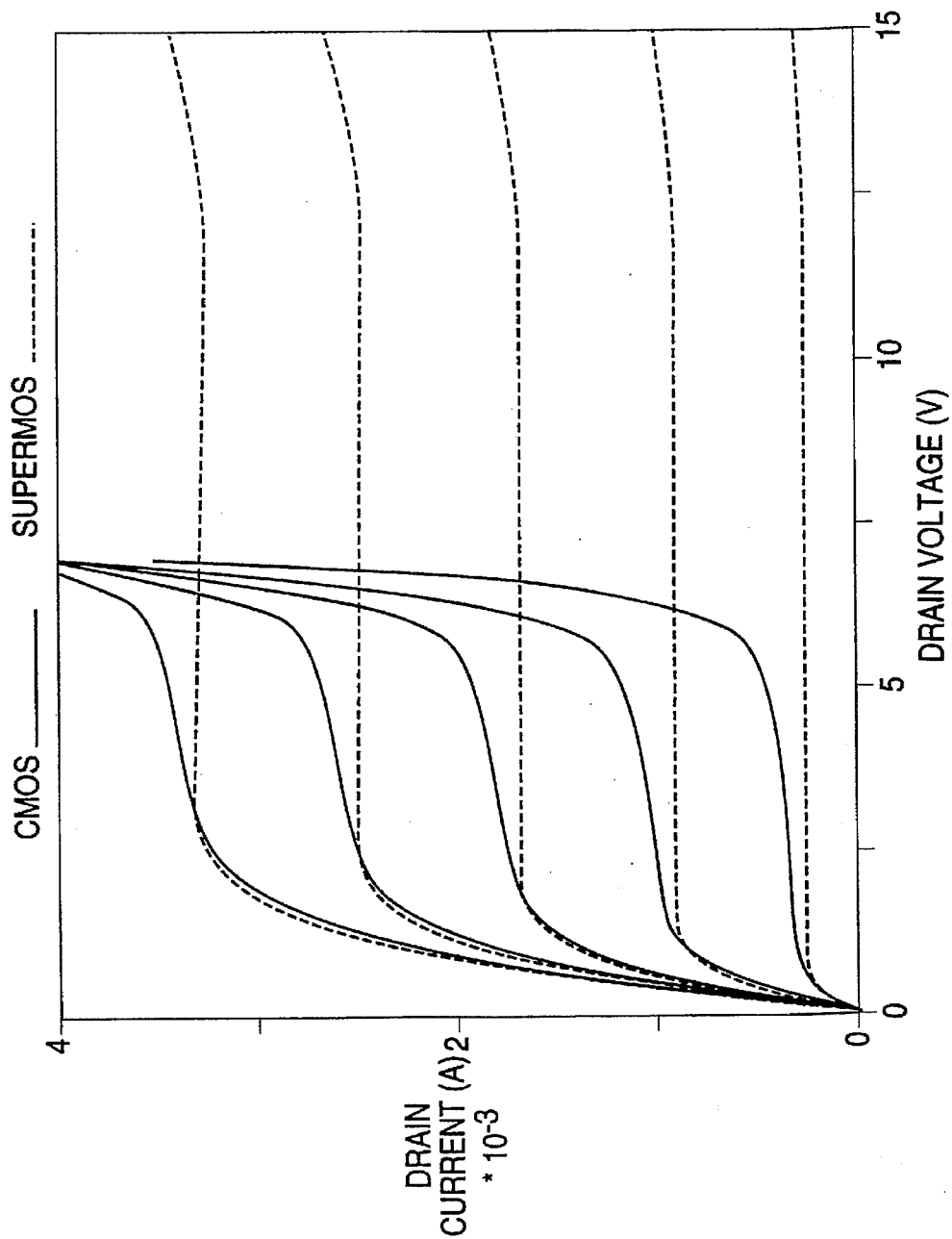
FIG. 7 shows waveforms illustrating the excellent drain voltage vs. drain current characteristics attained by transistor schemes, such as of the CMOS and SUPERMOS type, according to the present invention.

The excellent properties of the components fabricated according to the present invention are shown in FIG. 7 in which the drain current is depicted as the function of the drain voltage for an invented component (referred to as SUPERMOS) and a CMOS transistor.

Figure 8:
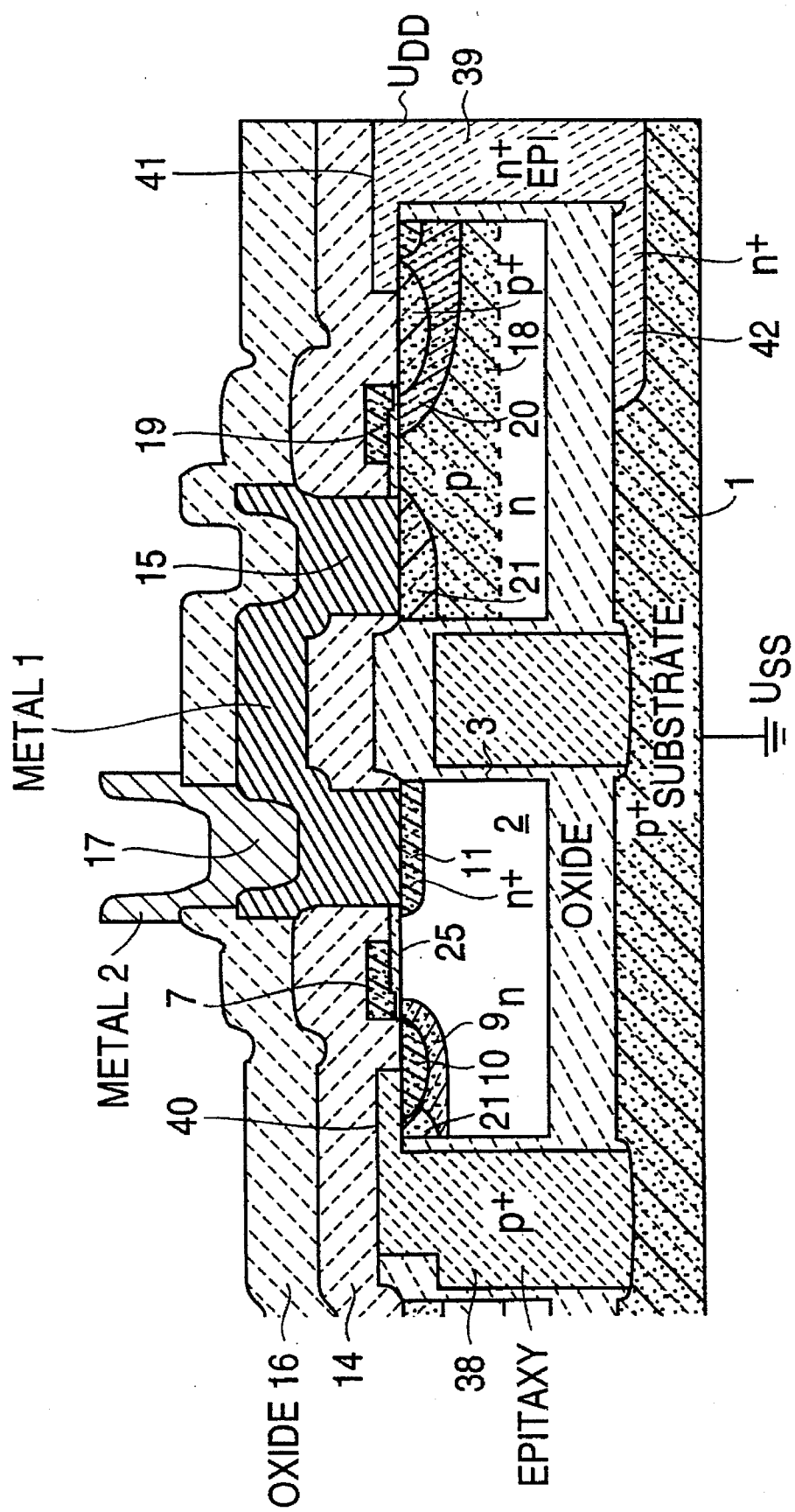

FIG. 8 shows another preferred embodiment of an integrated circuit which has in addition an n$^+$-diffusion strip 42 in the p-doped substrate 1. The strip 42 is connected to the positive potential of the voltage supply $U_{DD}$. The space charge region between the n$^+$-doped region 42 and the p$^+$doped substrate serves as a barrier layer for these both potentials. By way of illustration, the source region of the so-called p-SUPERMOS transistors is connected to the n+strips 42 via a suitable sinker 39. By means of this construction, the wiring layer (often the third layer) on the surface of the circuit previously required for the connection of the voltage supply is obviated and can be placed in the silicon. Now the line connection occurs solely via the silicon paths due to which heterogenic material interfaces are avoided which due to aging effects have become a very critical part of highly integrated circuits.

Figure 9:
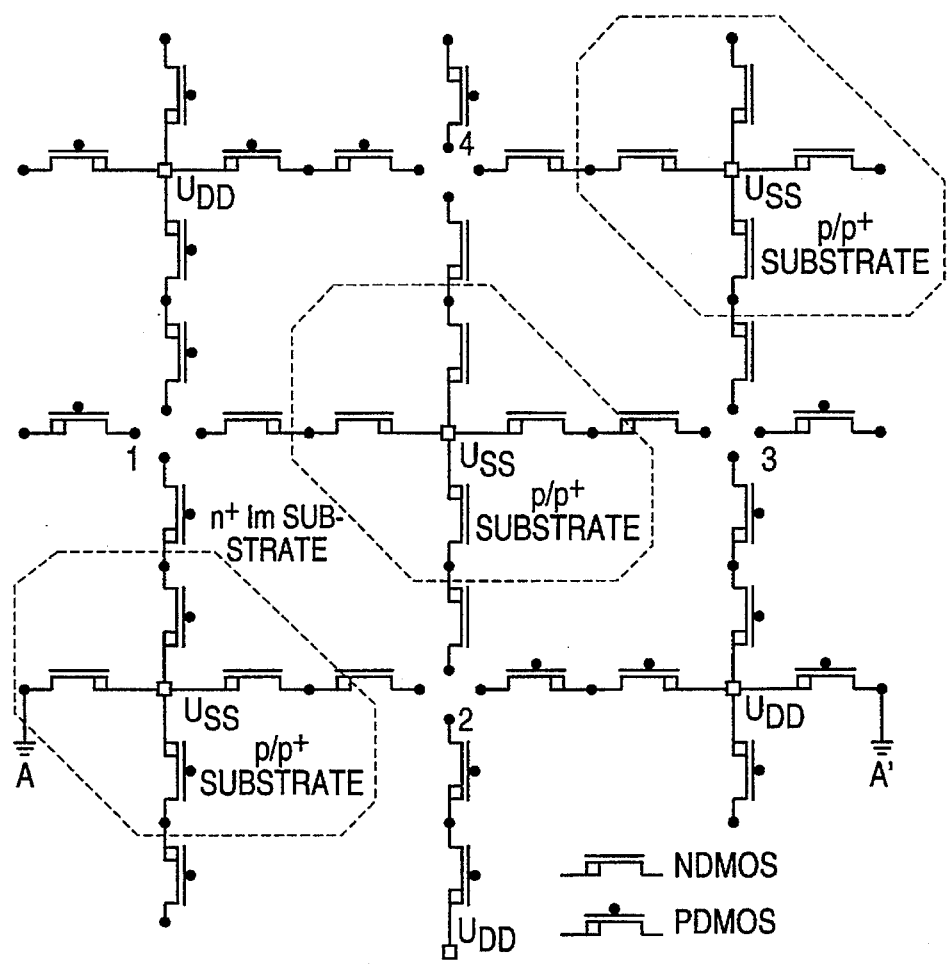

FIG. 9 shows an advantageous transistor configuration which moreover has a honeycomblike connection for the current (dotted lines) with n$^+$-doped leads for positive voltage supply. The positive voltage supply is denoted with $U_{SS}$ and the negative voltage supply with $U_{DD}$.

Figure 10:
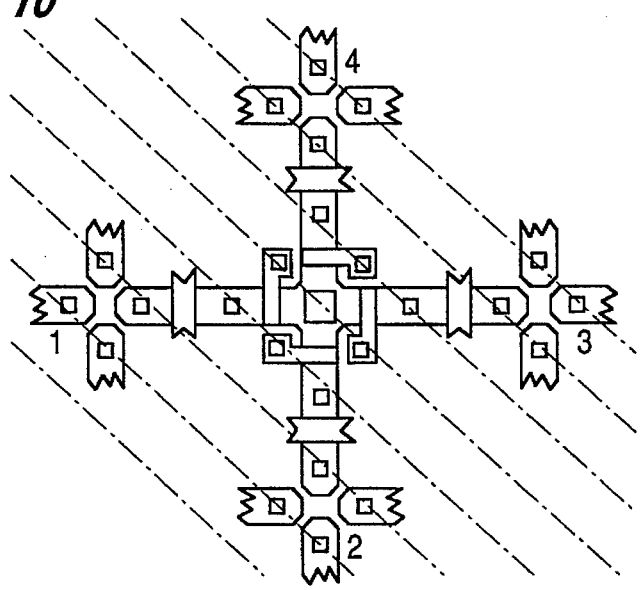

FIG. 10 shows a preferred transistor configuration having a star-shaped transistor configuration with the wiring direction turned 45°. Turning the wiring 45° in relation to the transistors results in a very short intracell-line length and at the same time a data path structure.

Figure 11A:
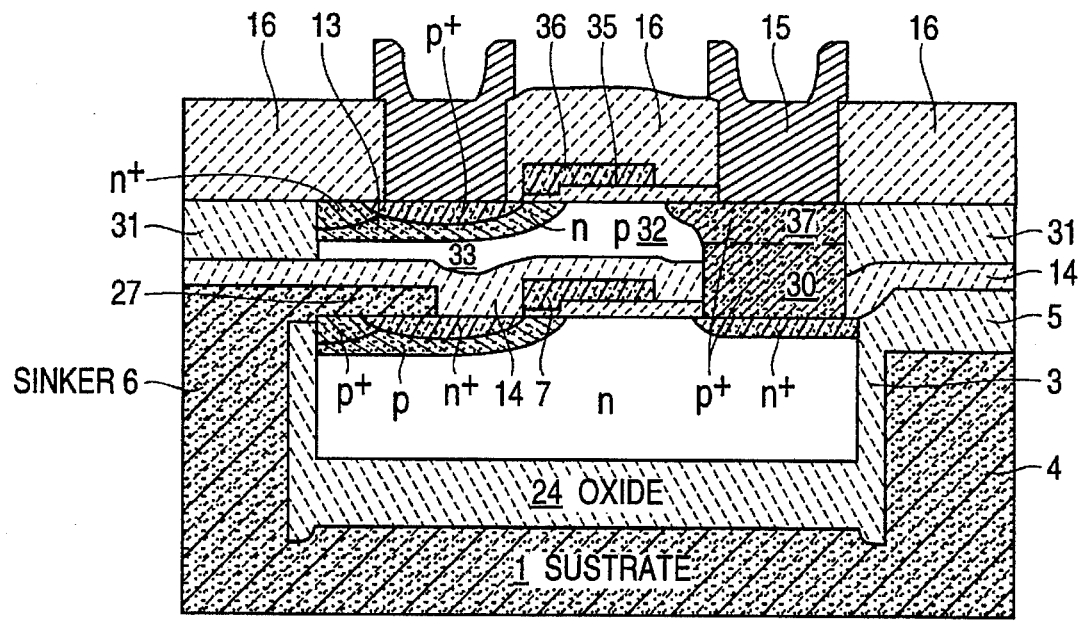
Figure 11B:
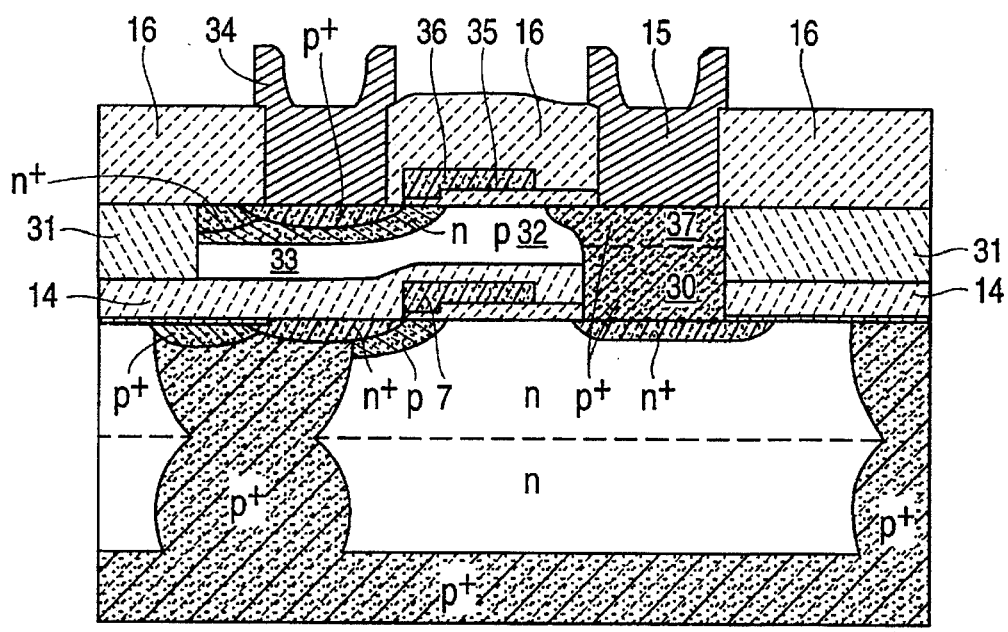

FIGS. 11a and 11b show designs of integrated circuits in which a complementary transistor is placed vertically onto the first transistor. The respective fabrication cycle begins following the intermediate oxide (14). A spacer oxide (31) is provided which forms a barrier about the island for a to-be-created crystalline silicon thin film transistor. Now a seed opening is etched into the oxide (14) in the drain region of the first-mentioned transistor. Crystalline silicon is grown by means of selective epitaxy from this seed opening; preferably with a high p-type doping. The selective crystalline-growing silicon continues to grow laterally over the transistor (7) and finally continues to grow over the spacer oxide (31). The superfluous, grown silicon is removed by chemo-mechanical polishing with selective action until the the crystalline film fills the island within the space oxide (31) flush.

In overgrowth, the epitaxial film (32) is preferably p-doped. At the far end of the overgrowth, the source and gate of a PDMOS transistor having the source region (34), the channel region (33), preferably two-step gate-oxide (35) as well as the gate (36) are fabricated. The source implantation (34) is also utilized to fabricate the drain region (37). The process cycle of this thin-film PDMOS transistor fabricated in this manner can be optimized in any manner, including optimized in rate of rise, switch-on resistance, Miller type, and in no leakage currents, in particular at the bottom of the film.

It also has to be pointed out that with these process steps a very plane silicon surface with negligible topographic variations is created, which in addition contributes making aggressive structural minimization possible without any fundamental difficulties. On the contrary, it is especially distinguishing that the fabrication of this thin-film transistor profits from progressive minimization, because it reduces the lateral dimensions and, therefore, the thermal budget (product of the process temperature and the process time) for the lateral crystalline overgrowth.

Following the process state obtained in this manner, the intermediate oxide (16) is provided and the first metal wiring plane is executed with metal (15).

The present invention has been described using preferred embodiments. However, the present invention should not be considered as being restricted to those embodiments or even to obvious modifications thereof but can include other embodiments and modifications thereof that are within the spirit and scope of the appended claims.

What is claimed is:

1. An integrated circuit having at least two active components constituted by semiconductor elements and being characterized by:

a highly conductive substrate which is connected to one pole of a voltage supply source;

a semiconductor layer provided on a main surface of said substrate in a manner in which said semiconductor layer is electrically isolated from said substrate and is disposed as plural semiconductor layer sections, said semiconductor layer sections being respectively isolated from each other by providing isolation regions therebetween;

providing in each semiconductor layer section at least one transistor as an active component thereof; and lateral deep diffusion regions provided in said semiconductor layer each of said lateral deep diffusion regions being disposed so as to effect locally a direct electrical connection between said highly conductive substrate and a corresponding active region of individual ones of said active components.

2. A circuit according to claim 1, wherein said highly conductive substrate is formed of a semiconductor material.

3. A circuit according to claim 2, wherein said highly conductive substrate being formed of $p^+$-silicon material.

4. A circuit according to claim 1, wherein said isolation regions are formed by barrier p/n junctions.

5. A circuit according to one of the claims 1 to 3, wherein said isolation regions are formed by dielectric isolation layers.

6. A circuit according to claim 1,
wherein each of said isolation regions is formed of a substantially hollow cylindrical oxide region, which region is extended to said substrate and filled with the material of the type of conductivity of said highly conductive substrate and onto which an isolation layer is provided.

7. A circuit according to claim 6,
wherein said isolation layer is a silicon oxide layer.

8. A circuit according to claim 1,
wherein said highly conductive substrate is connected to a negative pole of said voltage supply source.

9. A circuit according to claim 1,
wherein said highly conductive substrate is of one conductivity type and has formed therein a plurality of regions of opposite conductivity type thereto, respectively.

10. A circuit according to claim 9,
wherein said plurality of regions are $n^+$-diffusion strip regions which are orthogonally or honeycomb-shaped and are connected to a positive pole of said voltage supply source, a negative pole of said voltage supply source being connected to said highly conductive substrate.

11. A circuit according to claim 1,
wherein said active components in individual ones of said semiconductor layer sections are electrically connected via corresponding ones of said deep diffusion regions, constituting sinker regions, to said highly doped substrate, said semiconductor layer sections having one of an n-type and p-type conductivity and both the sinker regions and said substrate having the other of said n-type and p-type conductivity.

12. A circuit according to claim 1 wherein said active components being arranged in a star-shaped configuration.

13. A circuit according to claim 1,
wherein at least one semiconductor layer section includes a stacked arrangement of complementary transistors, in which an upper PMOS transistor is vertically separated, by an isolation layer, from another transistor located beneath said PMOS transistor.

14. A circuit according to claim 13,
wherein fabrication of the upper transistor in each said stacked arrangement is by means of selective epitaxy and lateral overgrowth.

15. A circuit according to claim 5,
wherein complementary transistors including an $n^+$-p-n-$n^+$ (NMOS) transistor, and a $p^+$-n-p-$p^+$ (PMOS) transistor are provided in different ones of said semiconductor layer sections.

16. A circuit according to claim 15,
wherein a thin gate oxide included in each said NMOS transistor, crucial for the critical frequency of the NMOS transistors, is disposed to only overlie the p-zone, and wherein a thin gate oxide included in said PMOS transistors is disposed to overlie only the n-zone.

17. A circuit according to claim 15 or 16, wherein said p-, respectively n-zones are substantially shorter than the smallest structural width which can be produced by process lithography.

18. A circuit according to claim 16, wherein the remaining oxide under the gate electrode is substantially thicker in order to reduce the parasitic gate-drain capacitances and raise the lifetime of the transistors.

19. A circuit according to claim 1, wherein said highly conductive substrate is formed of semiconductor material having one of a p-type and an n-type conductivity and said semiconductor layer is an epitaxial layer having the other one of said p-type and n-type conductivity.

20. A circuit according to claim 19, wherein said isolation regions effect barrier p/n junctions with the semiconductor layer sections adjacent thereto and are extended inwardly from an upper surface of said semiconductor layer to a depth in which direct contact is made with the substrate, respectively, said isolated regions being formed from the same material as that for forming said lateral deep diffusion regions, respectively, and said isolation regions being electrically isolated from higher level layers including wirings by the formation of a thick oxide film thereon, respectively.

21. A circuit according to claim 1, wherein said isolation regions effect barrier p/n junctions with the semiconductor layer sections adjacent thereto and are extended inwardly from an upper surface of said semiconductor layer to a depth in which direct contact is made with the substrate, respectively, said isolated regions being formed from the same material as that for forming said lateral deep diffusion regions, respectively, and said isolation regions being electrically isolated from higher level layers including wirings by the formation of a thick oxide film thereon, respectively.

22. A circuit according to claim 1, wherein said highly conductive substrate and said semiconductor layer are electrically isolated by a barrier p/n-junction or a dielectric isolation layer.

23. A circuit according to claim 10, wherein each $n^+$-diffusion strip region is connected to a same conductivity type epitaxial region extending vertically outwardly in a manner in which contact is effected between an active region of a transistor, included in the corresponding semiconductor layer section, and said $n^+$-diffusion strip region.

* * * * *